(12) United States Patent
Yu et al.

(10) Patent No.: US 6,258,715 B1
(45) Date of Patent: Jul. 10, 2001

(54) PROCESS FOR LOW-K DIELECTRIC WITH DUMMY PLUGS

(75) Inventors: Chen-Hua Yu; Shwangming Jeng, both of Hsin-chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/228,125

(22) Filed: Jan. 11, 1999

(51) Int. Cl.⁷ .................................... H01L 21/4763
(52) U.S. Cl. ................. 438/648; 438/629; 438/637; 438/778; 438/780; 438/787; 257/751; 257/758
(58) Field of Search ....................... 438/648, 637, 438/629, 778, 780, 787; 257/522, 751

(56) References Cited

U.S. PATENT DOCUMENTS

| | | | |
|---|---|---|---|
| 5,319,224 | 6/1994 | Sakashita et al. | 257/203 |
| 5,430,325 | 7/1995 | Sawada et al. | 257/618 |
| 5,580,810 | 12/1996 | Katto et al. | 437/52 |
| 5,629,236 | 5/1997 | Wada et al. | 438/607 |
| 5,855,962 * | 1/1999 | Cote et al. | 427/376.2 |
| 6,016,000 * | 1/2000 | Moslehi et al. | 257/522 |
| 6,016,600 * | 1/2000 | Moslehi | 257/522 |

* cited by examiner

Primary Examiner—David Nelms
Assistant Examiner—Reneé R. Berry
(74) Attorney, Agent, or Firm—George O. Saile; Stephen B. Ackerman

(57) ABSTRACT

Low dielectric inter-metal dielectric (IMD) layers made of hydrogen silsesquioxane (HSQ) or methyl silsesquioxane (MSQ) spin-on-glass do not have good thermal conductivity as compared to regular oxides, in addition the adhesion of HSQ or MSQ is worse than that of oxide to oxide layers Methods are disclosed and illustrated to improve the heat transfer by providing metal dummy plugs under and/or around bonding pads or between metallization layers. The arrangement and numbers of dummy plugs depends on the heat to be transferred and varies with the application. Good thermal conductivity is of particular importance because the effects of high local temperature around bonding pads during chip bonding results in thermal stress and delamination of the IMD layers. The use of bonding pads provides other benefits as well.

25 Claims, 4 Drawing Sheets

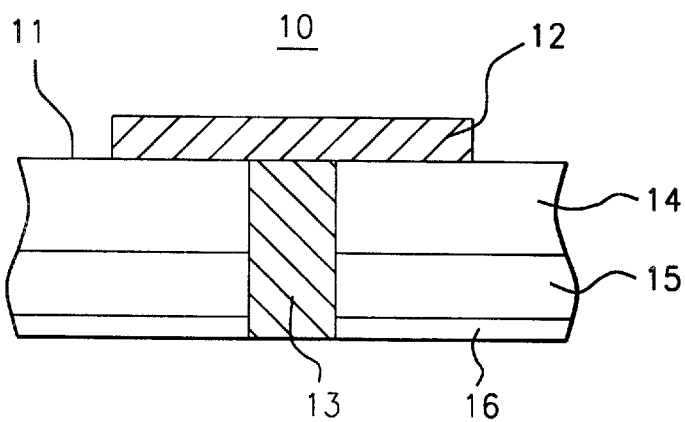
FIG. 1 – Prior Art
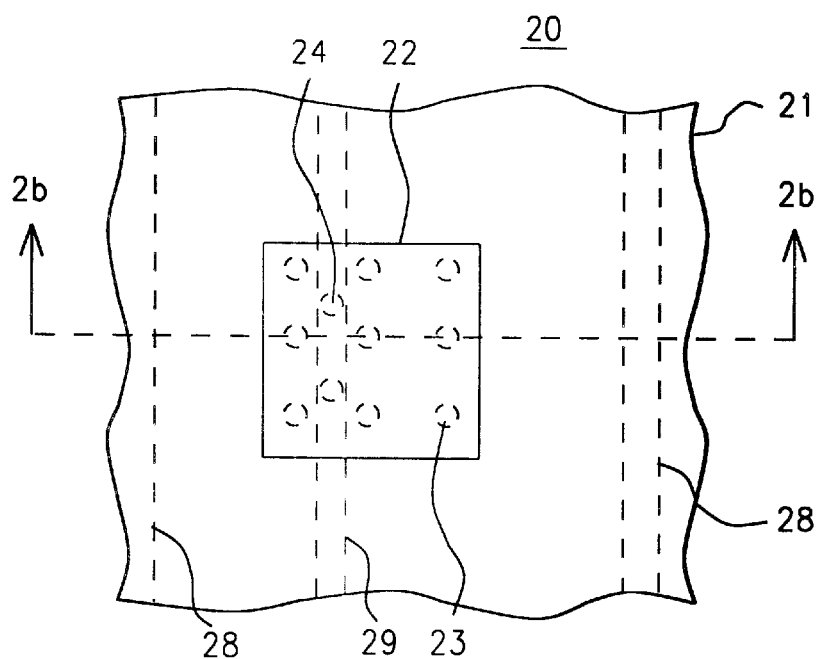
FIG. 2a
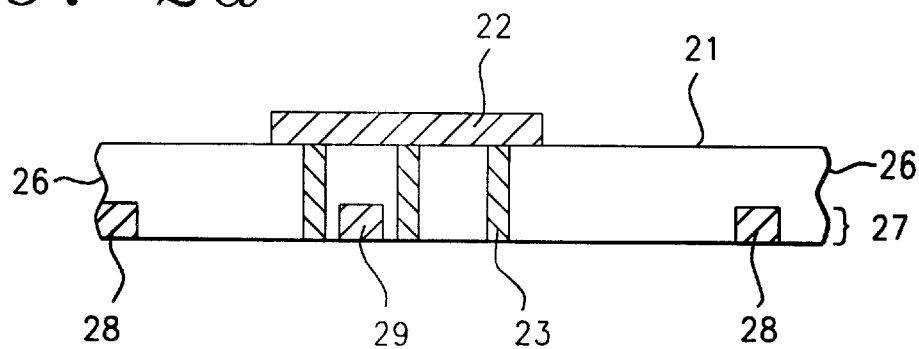
FIG. 2b

PROCESS FOR LOW-K DIELECTRIC WITH DUMMY PLUGS

BACKGROUND OF THE INVENTION

1. Field of the Invention

The invention relates to methods of fabricating a semiconductor wafer, and more particularly to methods of thermal stress release by providing dummy plugs in a low-k, low thermal conductivity dielectric.

2. Description of the Related Art

Materials used for intermetal dielectrics (IMDs) in the related art comprise plasma enhanced silicon oxide (PE-OX), plasma enhanced tetraethyl orthosilicate glass (PETEOS), spin-on-glass (available from Allied Signal as #314), low-k dielectric (Dow-Corning $FO_x$-15), and others. Along with their advantages come certain disadvantages such as the problem of moisture uptake (through etching) and release, contributing to bonding failure or poor thermal conductivity in case of the low-k dielectric.

FIG. 1 illustrates a typical IMD arrangement of the prior art, and having the problems discussed in the previous paragraph, showing a partial cross-section of a semiconductor wafer 10. Reference number 11 indicates the top of the wafer, with a bonding pad 12 on top of 11. A metal plug 13 connects the bonding pad 12 to a metal line (not shown). A PE-OX or PETEOS layer 14 is deposited on top of a SOG or low-k dielectric layer 15. Layer 15 in turn is deposited on a liner PE-OX layer 16.

In ultra-large-scale-integration (ULSI) interconnect scaling has become the performance limiting factor for new designs. Both interconnect resistance and capacitance are limiting factors to overall performance. To minimize crosstalk and RC time delay it is very important to keep the inter-metal dielectric capacitance as low as possible. This has been done through the introduction of inter-metal dielectrics (IMD's) with a low dielectric constant (low-k) such as hydrogen silsesquioxane (HSQ) and methyl silsesquioxane (MSQ). One drawback of these materials is that their thermal conductivity is not as good as that of regular oxides such as silicon oxide ($SiO_2$). The reduced thermal conductivity of these low-k insulators introduces thermal stress during chip bonding, because the local temperature around bonding pads is then especially high. This thermal stress may cause delamination of inter-metal dielectric and metallization layers.

One method to alleviate the poor thermal conductivity is to introduce "dummy plugs" made of various thermally conductive materials, which transfer the excessive heat around the bonding pads and distribute it to other layers of the semiconductor wafer. Another problem faced with low-k IMDs is that their adhesion to oxides is worse than that of oxide to oxide. Dummy plugs alleviate this problem by tying the IMD layer to the other layers.

The use of dummy pads is not new in the manufacture of semiconductor chips. There are a number of U.S. patents that describe their use and which are listed below.

U.S. Pat. No. 5,629,236 (Wada et al.) shows a method of converting polycrystal Al wiring to single crystal Al (connected by vias) to reduce electromigration. A dummy plug is used to supply atoms to reduce electromigration.

U.S. Pat. No. 5,430,325 (Sawada et al.) describes a chip having a dummy pattern. The dummy pattern reduces recognition errors.

U.S. Pat. No. 5,319,224 (Sakashita et al.) teaches a method for a bond pad layout.

It should be noted that none of the above cited examples of the related prior art address alleviating the poor thermal conductivity and adhesion problems of HSQ and MSQ.

SUMMARY OF THE INVENTION

It is an object of the present invention to provide methods to improve thermal conductivity and to reduce the resulting thermal stress and subsequent delamination, when using low-k, low thermal conductivity silsesquioxane inter-metal dielectric layers in the manufacture of semiconductor wafers.

Another object of the present invention is to improve the adhesion of these low-k inter-metal dielectric layers to other types of oxide layers.

A further object of the present invention is to improve the removal of moisture taken up during the etching step.

These objects have been achieved by providing heat transferring metal dummy plugs under and/or outside bonding pads, placing dummy plugs in bonding pad areas that are unused, and by providing dummy plugs between any two metallization layers. Dummy plugs also provide increased mechanical strength by tying together the different types of layers encountered in a semiconductor wafer.

BRIEF DESCRIPTION OF THE DRAWINGS

FIG. 1 is a prior art partial cross section of the top layers of a semiconductor wafer showing a bonding pad and via filled with a metal plug.

FIG. 2a is a top view of a part of a semiconductor wafer showing a bonding pad and dummy plugs of the present invention.

FIG. 2b is a cross-section of FIG. 2a.

FIG. 3b is a cross-section of FIG. 3a.

FIG. 4b is a cross-section of FIG. 4a.

DESCRIPTION OF THE PREFERRED EMBODIMENT

Figure 3A:
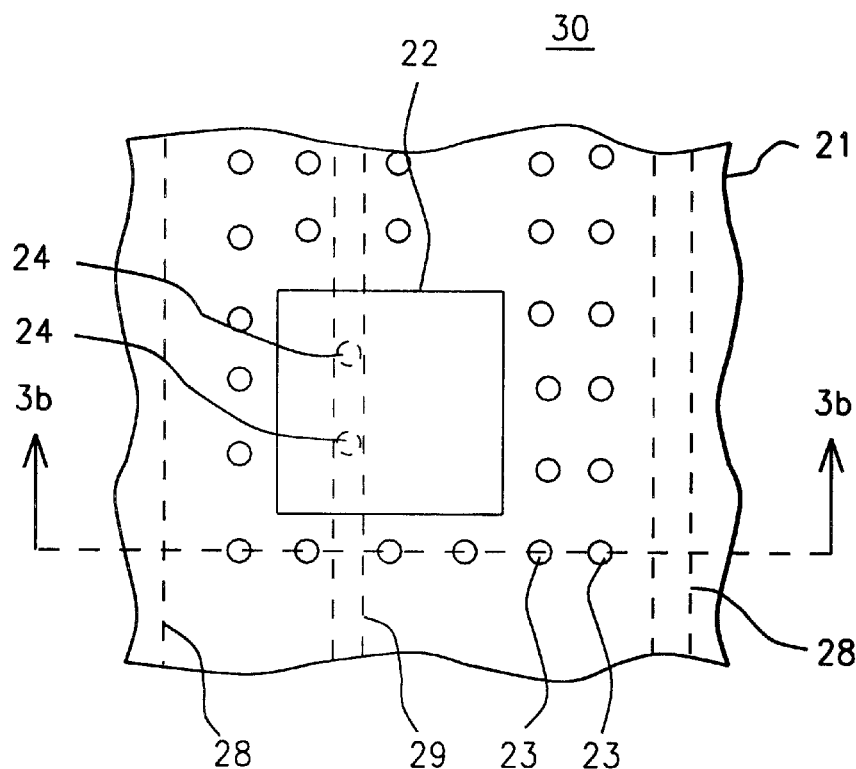
FIG. 3a is a top view of a part of a semiconductor wafer showing a bonding pad surrounded by dummy plugs of the present invention.

The methods of the present invention of providing metal dummy plugs offer a number of features which advance the art of semiconductor wafer manufacture by promoting better heat dissipation, improved adhesion of low-k inter-metal dielectric (IMD) layers, reducing thermal stress delamination, and increased moisture release. Heat transfer away from the bonding pad to a lower metallization layer occurs through the metal of the dummy plug. As such, the number and arrangement of these plugs is of significance since the heat transfer depends on these parameters. Dummy plugs can be used either underneath and/or around bonding pads as well as in unused bonding pad areas. Dummy plugs can be implemented between the semiconductor wafer top surface and any metal level, not just the last metal layer i.e. the top most metal layer, and they can be used between metal layers.

The various contemplated methods illustrated in FIGS. 2a to 5b and disclosed in the subsequent description all have in common a semiconductor wafer which may be patterned with transistors, diodes, capacitors, resistors or similar devices or which may not contain such devices. On top of the semiconductor wafer is a sandwich of IMD layers and metallization layers, followed by a final IMD layer to seal off the top surface. FIGS. 2a to 5b are not to scale and are only intended as examples of the methods of the invention and thus are not intended to limit the scope of the invention.

The detailed method which creates this sandwich structure, comprises:

depositing at least one set of an alternating inter-metal dielectric layer and metallization layer on top of the semiconductor wafer, providing each metallization layer with a plurality of metal lines, depositing a final inter-metal dielectric layer on top of a final metallization layer.

The dielectric layer may consist of one or more dielectric depositions depending on the requirements of the process.

The First Embodiment

The method of the first embodiment, as illustrated in FIG. 2a and FIG. 2b, shows a section of a semiconductor wafer 20 with top surface 21 and a bonding pad 22 on top surface 21. The number of bonding pads can vary, but there is at least one bonding pad 22 on top of the final IMD layer 26. A plurality of dummy plugs 23 is provided underneath the bonding pad 22. The arrangement and number of dummy plugs is for illustrative purposes only and is not intended to limit the scope of the invention but is determined by the heat transfer requirements. The bonding pad 22 is connected using at least one metal via plug 24, and typically more than one, to a metal line 29 underneath. FIG. 2b is a cross-section of FIG. 2a and shows bonding pad 22 placed on top surface 21. Below are IMD layer 26 and metallization layer 27, showing metal lines 28 and 29. The cross-section reveals three of the dummy plugs 23 connecting bonding pad 22 with metallization layer 27 but none of the dummy plugs touching metal lines 28 or 29. Only three metal lines and cross sections thereof are shown for the sake of clarity though typically many more metal lines are used.

The Second Embodiment

Figure 3B:
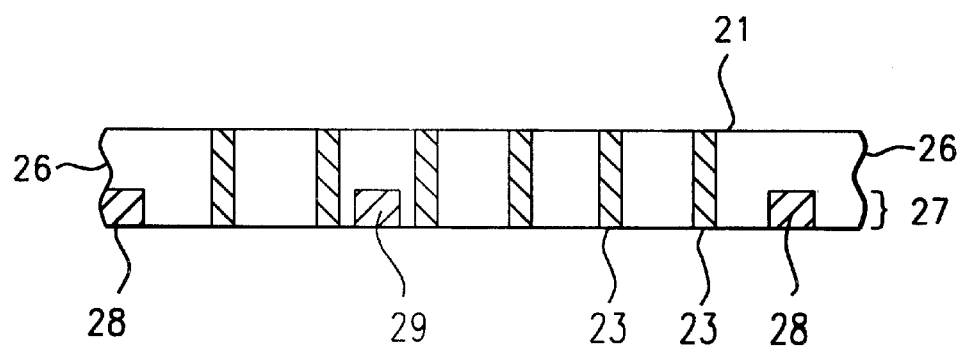

The method of the second embodiment, as illustrated in FIG. 3a and FIG. 3b, shows a section of a semiconductor wafer 30 with top surface 21 and a bonding pad 22 on top surface 21. The number of bonding pads can vary, but there is at least one bonding pad 22 on top of the final IMD layer 26. A plurality of dummy plugs 23 is provided outside of bonding pad 22. The arrangement and number of dummy plugs is for illustrative purposes only and is not intended to limit the scope of the invention but is determined by the heat transfer requirements. The bonding pad 22 is connected using at least one metal via plug 24, but using typically more than one, to a metal line 29 underneath. FIG. 3b is a cross-section of FIG. 3a and shows bonding pad 22 placed on top surface 21. Below are IMD layer 26 and metallization layer 27, showing metal lines 28 and 29. The cross-section reveals six of the dummy plugs 23 penetrating IMD layer 26 and terminating with metallization layer 27. Note that dummy plugs 23 do not contact metal lines 28 or 29. Only three metal lines and cross sections thereof are shown for the sake of clarity though typically many more metal lines are used.

The Third Embodiment

Figure 4A:
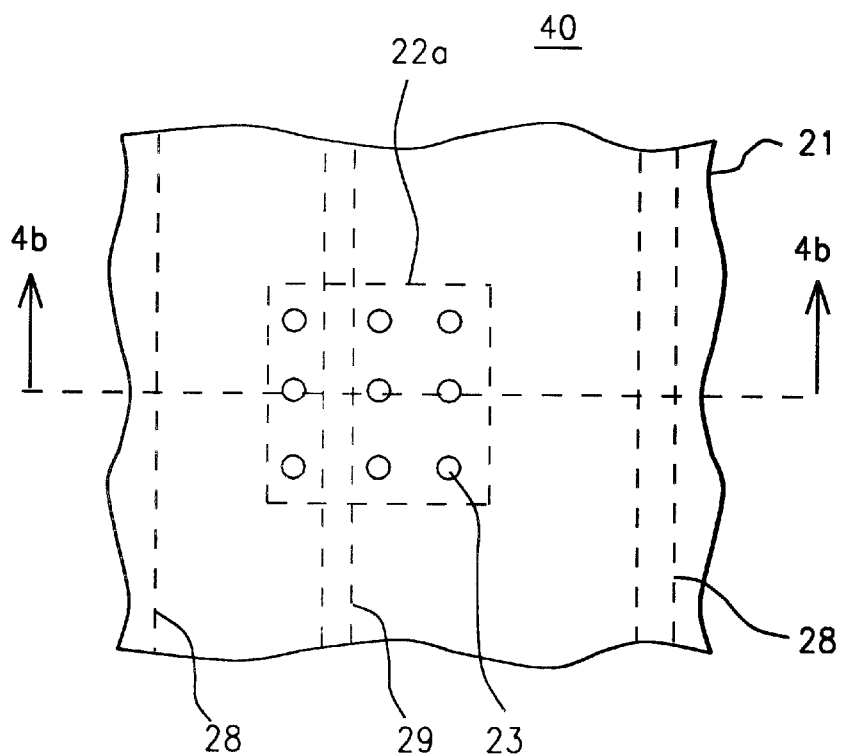
FIG. 4a is a top view of a part of a semiconductor wafer showing dummy plugs in an unused bonding pad area of the present invention.
Figure 4B:
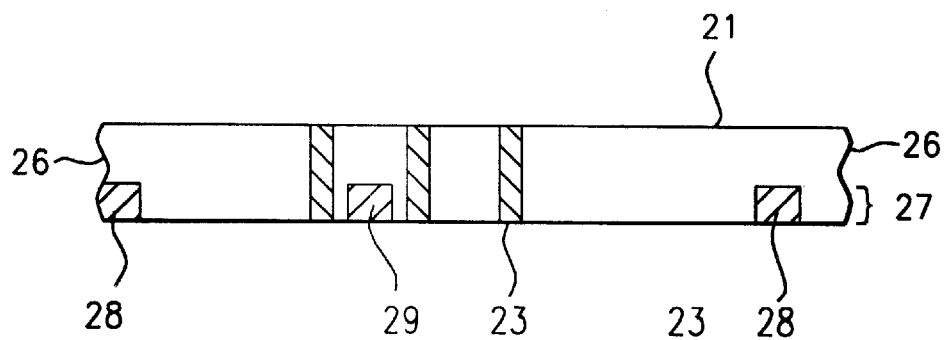

The method of the third embodiment, as illustrated in FIG. 4a and FIG. 4b, shows a section of a semiconductor wafer 40 with top surface 21 and provided with a plurality of dummy plugs 23, of which nine are shown, in an area 22a reserved for a bonding pad but not used. The arrangement and number of dummy plugs is for illustrative purposes only and is not intended to limit the scope of the invention but is determined by the heat transfer requirements. FIG. 4b is a cross-section of FIG. 4a. The cross-section reveals three of the dummy plugs 23 penetrating IMD layer 26 and terminating at metallization layer 27. Layer 27 is the metallization layer with embedded metal lines 28 and 29. Note that dummy plugs 23 do not contact either metal line 28 or 29. Only three metal lines and cross sections thereof are shown for the sake of clarity though typically many more metal lines are used.

The Fourth Embodiment

Figure 5A:
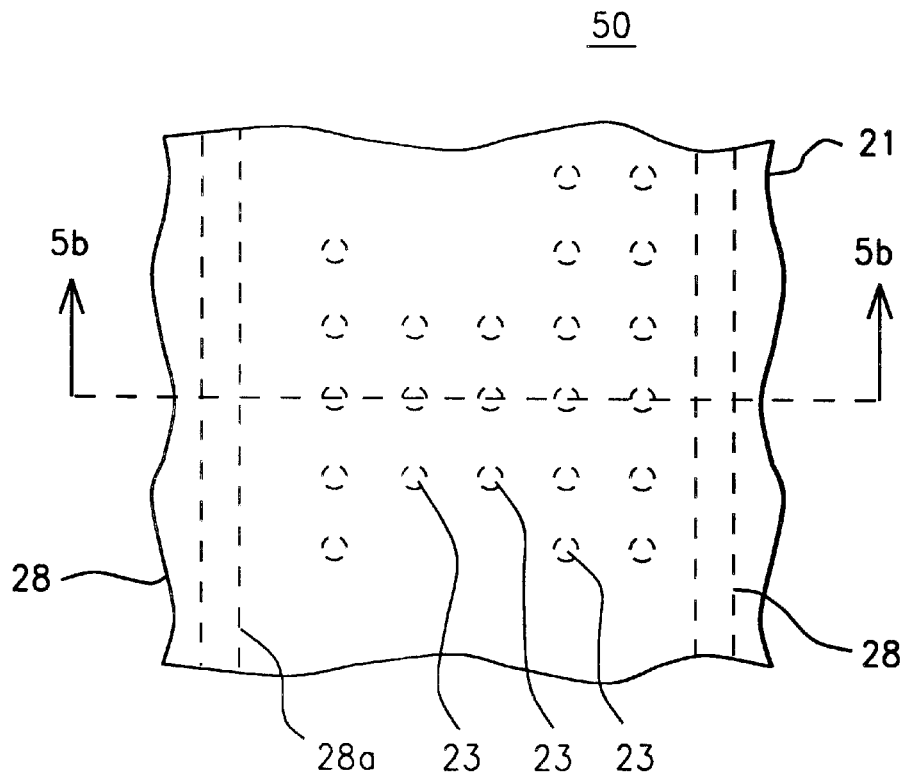
FIG. 5a is a top view of a part of a semiconductor wafer showing another arrangement of dummy plugs of the present invention.
Figure 5B:
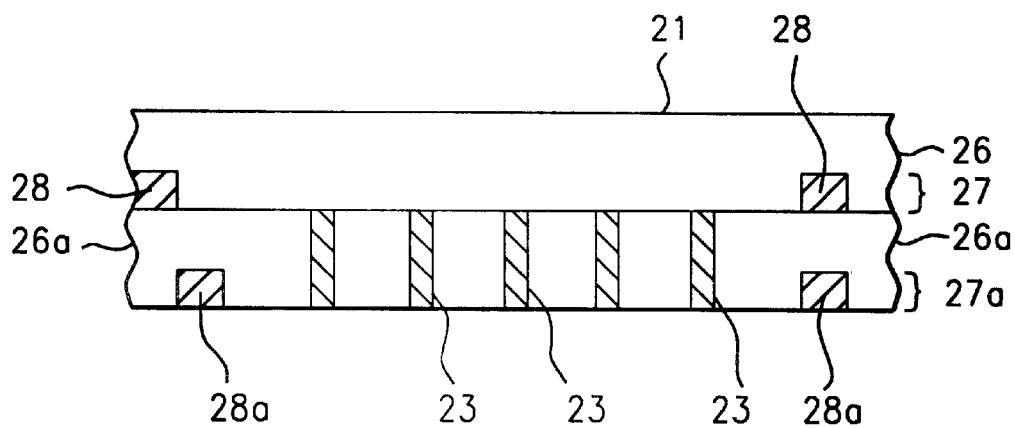
FIG. 5b is a cross-section of FIG. 5a showing dummy plugs between two metallization layers.

The method of the fourth embodiment, as illustrated in FIG. 5a and FIG. 5b, shows a section of a semiconductor wafer 50 with top surface 21 and provided with a plurality of dummy plugs 23. The arrangement and number of dummy plugs 23 is for illustrative purposes only and is not intended to limit the scope of the invention but is determined by the heat transfer requirements. FIG. 5b is a cross-section of FIG. 5a. The cross-section shows a final, or top, IMD layer 26 with a top surface 21, followed by metallization layer 27. After metallization layer 27 follow IMD layer 26a and metallization layer 27a. The cross-section additionally reveals five of the plurality of dummy plugs 23 penetrating IMD layer 26a and terminating at metallization layer 27a. The remainder of dummy plugs 23 are similarly disposed between metallization layer 27 and metallization layer 27a and penetrating IMD layer 26a. Metallization layers 27 and 27a have embedded metal lines 28 and 28a, respectively, where one metal line 28a is hidden from view in FIG. 5a by the overlying metal line 28. Note that none of dummy plugs 23 contacts metal lines 28 or 28a. Only two each of metal lines 28 and 28a and cross sections thereof are shown for the sake of clarity though typically many more metal lines are used.

FIG. 5b illustrates the method of dummy plugs 23 penetrating an inter-metal dielectric layer 26a placed between two successive metallization layers 27 and 27a. In this method, dummy plugs 23 may further penetrate the lower of the two metallization layers 27a to a subsequent metallization layer (not shown).

In any of the four embodiments each or any of the inter-metal dielectric layers 26 may consist of more than one inter-metal dielectric deposition. It is important to note that in all of the above recited embodiments, dummy plugs 23 penetrate either IMD layer 26 or 26a to allow for the transfer of heat.

The following features and characteristics of the present invention apply to all four of the above recited embodiments:

The low-k IMD layer is preferably selected from the group comprising hydrogen silsesquioxane (HSQ), methyl silsesquioxane (MSQ), hydrio polysilsesquioxane (H-PSSQ), methyl polysilsesquioxane (M-PSSQ), phenyl polysilsesquioxane (P-PSSQ), FLARE from Allied Signal, Microwave Materials, SILK from Dow Chemical, Xerogel, Nanoglass, or PAE-2, etc. The dielectric constant of above listed low-k dielectrics is typically 3, but ranges from 1 to 4.

Additionally the inter-metal dielectric layer may be further selected from the group comprising plasma enhanced silicon oxide, low-k spin-on-glass, tetraethyl orthosilicate glass, silicon nitride, phosphorus doped $SiO_2$, F—$SiO_2$, SiON, FSG, PSG, HDP-USG, HDP-$SiO_2$, SACVD, or $O_3$-TEOS, having a dielectric constant of typically 4, but ranging from 1 to 7. The dummy plug 23 is preferably made of material selected from the group comprising tungsten, Aluminum, Copper, Gold, Platinum, TaN, Ti, TiN, or Tn.

Providing dummy plugs according to the disclosed methods offers the advantages of releasing moisture that was taken up during etching, where the number of dummy plugs employed is also related to the amount of moisture released. Dummy plugs promote increased heat dissipation, particularly during chip bonding when the local temperature around the bonding pad is especially high and when thermal conductivity of the inter-metal dielectric layer is poor; the resulting reduction in thermal stress reduces potential delamination of the IMD layers to other oxide layers. Lastly dummy plugs make for a mechanically stronger wafer.

While the invention has been particularly shown and described with reference to the preferred embodiments thereof, it will be understood by those skilled in the art that various changes in form and details may be made without departing from the spirit and scope of the invention.

What is claimed is:

1. A method of providing dummy plugs on a semiconductor wafer, comprising the steps of:

depositing at least one set of an inter-metal dielectric layer and following metallization layer on top of said semiconductor wafer;

providing each said metallization layer with a plurality of metal lines;

depositing a final inter-metal dielectric layer on top of a final metallization layer;

placing at least one bonding pad on top of said final inter-metal dielectric layer; and providing a plurality of dummy plugs underneath at least one of said bonding pads, said dummy plugs penetrating said final inter-metal dielectric layer, where said dummy plugs, in addition to improved moisture release, reduce delamination of said inter-metal dielectric layers to other oxide layers.

2. The method of claim 1, wherein each or any said inter-metal dielectric layer consists of at least one inter-metal dielectric deposition.

3. The method of claim 1, wherein said dummy plugs penetrate more than one of said inter-metal dielectric layers.

4. The method of claim 1, wherein said dummy plugs are placed without touching any one of said metal lines.

5. The method of claim 1, wherein said inter-metal dielectric layer is selected from the group comprising hydrogen silsesquioxane, methyl silsesquioxane, hydrio polysilsesquioxane, methyl polysilsesquioxane, phenyl polysilsesquioxane, FLARE, SILK, Xerogel, Nanoglass, or PAE-2.

6. The method of claim 5, wherein said inter-metal dielectric layer has a dielectric constant ranging from 1 to 4.

7. The method of claim 1, wherein said inter-metal dielectric layer is further selected from the group comprising plasma enhanced silicon oxide, low-k spin-on-glass, tetraethyl orthosilicate glass, silicon nitride, phosphorus doped $SiO_2$, F—$SiO_2$, SiON, FSG, PSG, HDP-USG, HDP-$SiO_2$, SACVD, or $O_3$-TEOS.

8. The method of claim 1, wherein said dummy plug is made of material selected from the group comprising tungsten, aluminum, copper, gold, platinum, TaN, Ti, or TiN.

9. A method of providing dummy plugs on a semiconductor wafer, comprising the steps of:

depositing at least one set of an inter-metal dielectric layer and following metallization layer on top of said semiconductor wafer;

providing said metallization layer with a plurality of metal lines;

depositing a final inter-metal dielectric layer on top of a final metallization layer;

placing at least one bonding pad on top of said final inter-metal dielectric layer; and providing a plurality of dummy plugs outside of said bonding pads, said dummy plugs penetrating said final inter-metal dielectric layer, where said dummy plugs, in addition to improved moisture release, reduce delamination of said inter-metal dielectric layers to other oxide layers.

10. The method of claim 9, wherein each or any said inter-metal dielectric layer consists of at least one inter-metal dielectric deposition.

11. The method of claim 9, wherein said dummy plugs penetrate more than one of said inter-metal dielectric layers.

12. The method of claim 9, wherein said inter-metal dielectric layer is selected from the group comprising hydrogen silsesquioxane, methyl silsesquioxane, hydrio polysilsesquioxane, methyl polysilsesquioxane, phenyl polysilsesquioxane, FLARE, SILK, Xerogel, Nanoglass, or PAE-2.

13. The method of claim 9, wherein said inter-metal dielectric layer is further selected from the group comprising plasma enhanced silicon oxide, low-k spin-on-glass, tetraethyl orthosilicate glass, silicon nitride, phosphorus doped $SiO_2$, F—$SiO_2$, SiON, FSG, PSG, HDP-USG, HDP-$SiO_2$, SACVD, or $O_3$-TEOS.

14. The method of claim 9, wherein said dummy plug is made of material selected from the group comprising tungsten, aluminum, copper, gold, platinum, TaN, Ti, or TiN.

15. A method of providing dummy plugs on a semiconductor wafer, comprising the steps of:

depositing at least one set of an inter-metal dielectric metallization layer on top of said semiconductor wafer;

providing said metallization layer with a plurality of metal lines;

depositing a final inter-metal dielectric layer on top of a final metallization layer; and providing a plurality of dummy plugs in an area designated for bonding pads but void of said bonding pads, said dummy plugs penetrating said final inter-metal dielectric layer, where said dummy plugs, in addition to improved moisture release, reduce delamination of said inter-metal dielectric layers to other oxide layers.

16. The method of claim 15, wherein each or any said inter-metal dielectric layer consists of at least one inter-metal dielectric deposition.

17. The method of claim 15, wherein said dummy plugs penetrate more than one of said inter-metal dielectric layers.

18. The method of claim 15, wherein said inter-metal dielectric layer is selected from the group comprising hydrogen silsesquioxane, methyl silsesquioxane, hydrio polysilsesquioxane, methyl polysilsesquioxane, phenyl polysilsesquioxane, FLARE, SILK, Xerogel, Nanoglass, or PAE-2.

19. The method of claim 15, wherein said inter-metal dielectric layer is further selected from the group comprising plasma enhanced silicon oxide, low-k spin-on-glass, tetra-ethyl orthosilicate glass, silicon nitride, phosphorus doped $SiO_2$, $F$—$SiO_2$, SiON, FSG, PSG, HDP-USG, HDP-$SiO_2$, SACVD, or $O_3$-TEOS.

20. The method of claim 15, wherein said dummy plug is made of material selected from the group comprising tungsten, aluminum, copper, gold, platinum, TaN, Ti, or TiN.

21. A method of providing dummy plugs on a semiconductor wafer, comprising the steps of:

depositing at least two sets of an inter-metal dielectric layer and following metallization layer on top of said semiconductor wafer;

providing said metallization layers with a plurality of metal lines;

depositing a final inter-metal dielectric layer on top of a final metallization layer; and providing a plurality of said dummy plugs between any two of said metallization layers, where said dummy plugs, in addition to improved moisture release, reduce delamination of said inter-metal dielectric layers to other oxide layers.

22. The method of claim 21, wherein each or any said intermetal dielectric layer consists of at least one inter-metal dielectric deposition.

23. The method of claim 21, wherein said inter-metal dielectric layer is selected from the group comprising hydrogen silsesquioxane, methyl silsesquioxane, hydrio polysilsesquioxane, methyl polysilsesquioxane, phenyl polysilsesquioxane, FLARE, SILK, Xerogel, Nanoglass, or PAE-2.

24. The method of claim 21, wherein said inter-metal dielectric layer is further selected from the group comprising plasma enhanced silicon oxide, low-k spin-on-glass, tetra-ethyl orthosilicate glass, silicon nitride, phosphorus doped $SiO_2$, $F$—$SiO_2$, SiON, FSG, PSG, HDP-USG, HDP-$SiO_2$, SACVD, or $O_3$-TEOS.

25. The method of claim 21, wherein said dummy plug is made of material selected from the group comprising tungsten, aluminum, copper, gold, platinum, TaN, Ti, or TiN.

* * * * *